United States Patent
Akhtar et al.

(10) Patent No.: US 10,181,834 B2
(45) Date of Patent: *Jan. 15, 2019

(54) BALUNS FOR RF SIGNAL CONVERSION AND IMPEDANCE MATCHING

(71) Applicant: Texas Instruments Incorporated, Dallas, TX (US)

(72) Inventors: Siraj Akhtar, Richardson, TX (US); Richard Francis Taylor, Campbell, CA (US); Petteri Litmanen, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/672,070

(22) Filed: Aug. 8, 2017

(65) Prior Publication Data

US 2017/0338791 A1    Nov. 23, 2017

Related U.S. Application Data

(62) Division of application No. 15/003,030, filed on Jan. 21, 2016, now Pat. No. 9,735,753, which is a division
(Continued)

(51) Int. Cl.
*H01L 23/522* (2006.01)
*H03H 7/42* (2006.01)
(Continued)

(52) U.S. Cl.
CPC .............. *H03H 7/42* (2013.01); *H01F 21/12* (2013.01); *H01F 27/2804* (2013.01);
(Continued)

(58) Field of Classification Search
CPC ........ H01L 23/5227; H01L 2924/19042; H01L 2924/30107
See application file for complete search history.

(56) References Cited

U.S. PATENT DOCUMENTS 8,270,499 B2    9/2012  Chang et al.
9,276,056 B2 *  3/2016  Akhtar ................ H01L 23/5227

OTHER PUBLICATIONS

Mondal, J.; Li Li; Drye, J.; , "Design and characterization of an integrated passive balun for quad band GSM applications," Electronic Components and Technology Conference, 2006. Proceedings. 56th , vol., no., pp. 534-540, 2006.

* cited by examiner

*Primary Examiner* — Cuong Q Nguyen
(74) *Attorney, Agent, or Firm* — Kenneth Liu; Charles A. Brill; Frank D. Cimino

(57) ABSTRACT

In described examples of a magnetically coupled structure on a substrate with an integrated circuit device, the structure includes a first coil in a differential configuration, a second coil located above the first coil in a generally stacked configuration, and a center tap connection to a winding of the second coil. The first coil includes a first differential terminal, a second differential terminal, and metal windings of the first coil. The first coil's metal windings form a continuous spiral electrical path between the first and second differential terminals. The first coil's metal windings include turns and crossing connections between the turns. The turns are fabricated in an integrated circuit metal wiring level, and the crossing connections are fabricated in at least one metal level other than the metal wiring level containing the turns. The center tap is positioned to create a balanced structure.

15 Claims, 13 Drawing Sheets

Related U.S. Application Data of application No. 13/118,015, filed on May 27, 2011, now Pat. No. 9,276,056.

(60) Provisional application No. 61/352,206, filed on Jun. 7, 2010, provisional application No. 61/348,987, filed on May 27, 2010.

(51) Int. Cl.

| | |
|---|---|
| *H01L 23/64* | (2006.01) |
| *H01L 23/66* | (2006.01) |
| *H01L 49/02* | (2006.01) |
| *H01F 21/12* | (2006.01) |
| *H01F 27/28* | (2006.01) |
| *H01F 27/29* | (2006.01) |
| *H01F 41/04* | (2006.01) |

(52) U.S. Cl.
CPC ........... *H01F 27/29* (2013.01); *H01F 41/041* (2013.01); *H01L 23/5227* (2013.01); *H01L 23/645* (2013.01); *H01L 23/66* (2013.01); *H01L 28/10* (2013.01); *H01L 2223/6655* (2013.01); *H01L 2924/0002* (2013.01)

DIFFERENTIAL INDUCTOR IMPLEMENTATION

DIFFERENTIAL ON DIFFERENTIAL (TOP VIEW)

COPLANAR 2:1 BALUN IMPLEMENTATION

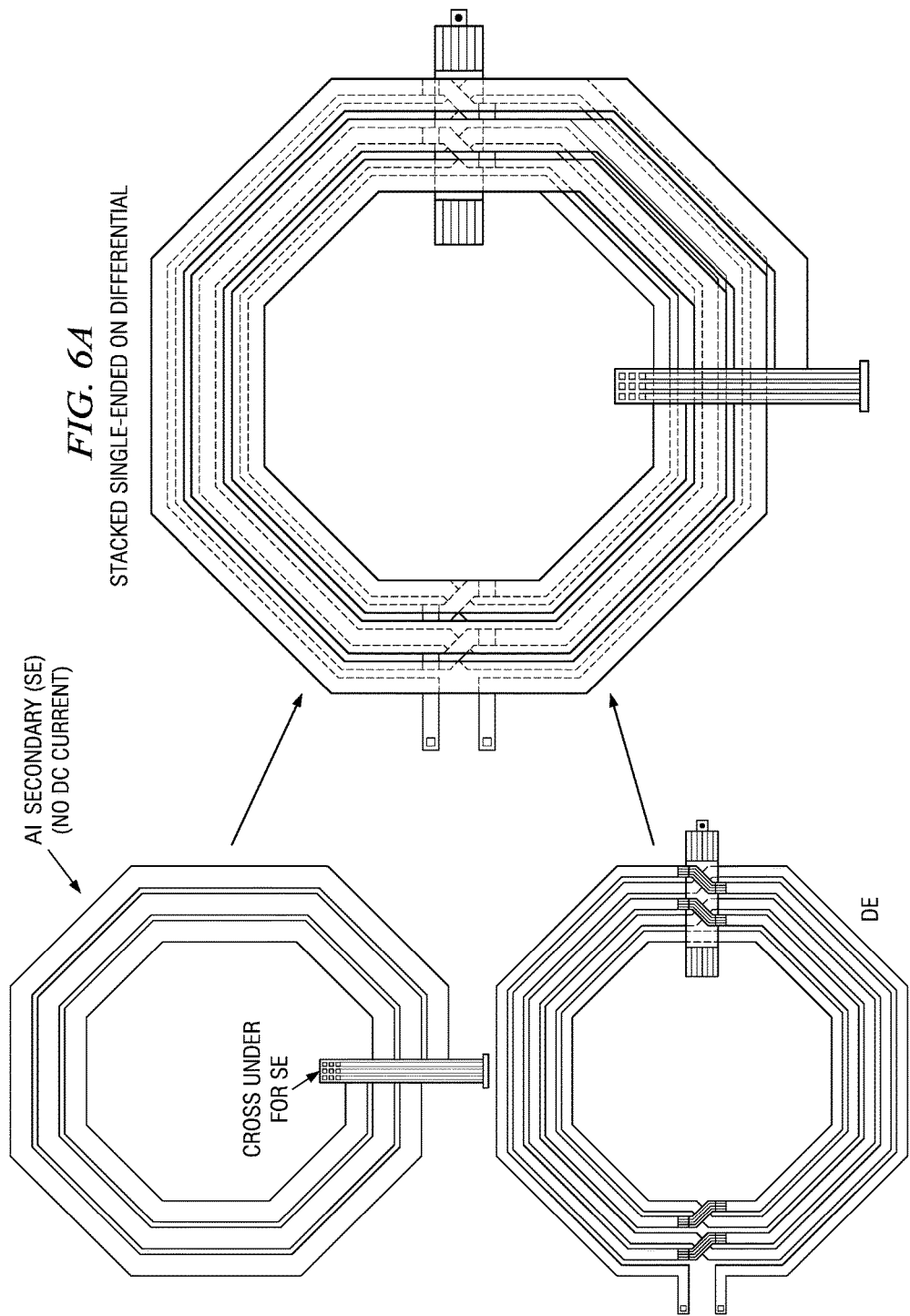

DIFFERENTIAL (DE) ON SINGLE-ENDED (SE) 5:3 BALUN (CROSS-SECTION)

BALUNS FOR RF SIGNAL CONVERSION AND IMPEDANCE MATCHING

CROSS-REFERENCE TO RELATED APPLICATIONS

This application is a divisional of U.S. patent application Ser. No. 15/003,030 filed Jan. 21, 2016, which is a divisional of U.S. patent application Ser. No. 13/118,015 filed May 27, 2011, which claims the benefit of U.S. Provisional Patent Application No. 61/352,206 filed Jun. 7, 2010 and of U.S. Provisional Patent Application No. 61/348,987 filed May 27, 2010, the entireties of all of which are incorporated herein by reference.

TECHNICAL FIELD

This relates to magnetically coupled primary and secondary coil structures, such as balun and transformer devices incorporated together with other components of integrated circuit and similar devices.

BACKGROUND

Radio frequency (RF) circuitry is implemented using differential signaling in order to eliminate common mode noise and increase dynamic range. However, real life signals like those received by an antenna or transmitted by an antenna are single-ended. So, somewhere in the receiver (RX) and transmitter (TX) circuitry, the signal is converted from single-ended to differential or from differential to single-ended. A device that utilizes magnetically coupled primary and secondary coil windings to convert radio frequency (RF) signals that are balanced about a common mode (viz., ground) reference (i.e., differential signals) to signals that are unbalanced (i.e., single-ended signals), and vice versa, is called a "balun." This conversion is typically done right after the low noise amplifier (LNA) stage for the RX chain and right after the power amplifier driver (PA Driver) stage for the TX chain. It can also be done right before the LNA and right before the PA Driver, respectively.

In addition to providing signal conversion, baluns are also used to provide impedance transformation between preceding and following stages. This allows for maximum power and signal transfer. Impedance matching is accomplished by changing the turns ratio between the two sides (primary and secondary) of the balun. This provides the ability to either step up or step down the impedance. Further, the physical value of the balun inductance may be an important parameter in enabling resonance to be achieved at the operating frequency. Especially in low voltage, high current applications, the DC resistance of the primary side may be important because it translates into lost headroom, thereby impacting linearity.

It is generally desired to keep the loss of baluns to a minimum. However in many digitally-oriented advanced deep submicron processes, back end-of-line (BEOL) processing steps typically use very thin metal layers in order to maximize the efficiency of routing for digital applications. And, with continuing downscaling of process dimensions, the thickness of metals used in BEOL layer stacks continues to decrease. Such thin metals, however, have very high RF loss (poor quality factor Q). In many situations, only one thick copper (Cu) metal layer may be made available for power routing. A thick aluminum (Al) redistribution layer (RDL) is also usually available for bonding (for wirebond or stud-bump flip-chip packaging). Copper is generally not currently used for bonding because of its high malleability. Aluminum, however, has higher resistivity and very poor electromigration characteristics.

In general, higher frequency baluns, such those implemented for wireless local area network (WLAN) applications at 2.5 GHz and 5.8 GHz frequencies, may be easier to realize on chip because of smaller area (need for small inductance) and higher Q with higher frequency. Low frequency cellular band baluns are generally more difficult to realize and are typically implemented in a single in-line package (SIP) configuration in an integrated product development (IPD) process or on a printed circuit board (PCB). See, J. Mondal, et al., "Design and Characterization of an Integrated Passive Balun for Quad Band GSM Applications," IEEE Electronic Components and Technology Conference, pp. 534-540, 2006, incorporated herein by reference.

The conventional approach to integrating baluns together with other components on a same chip has been to use a stacked arrangement of primary and secondary coil windings of two superposed differential inductors, with one coil formed using a first thick copper metal layer and the other coil formed using a second thick copper metal layer. At least two additional metals are needed to implement the cross-unders/crossovers for the two differential coils, respectively. The accomplishment of such approach in an integrated circuit fabrication flow, such as a modern CMOS process flow, that otherwise requires only a single copper layer is, however, disruptive and expensive because additional metal layer and masking steps have to be added that would not otherwise be necessary.

To avoid the need for adding another copper layer and masking step into a chip fabrication process with only one thick copper metal layer available, on-chip baluns have been implemented using coplanar configurations wherein the windings of primary and secondary coils of two differential inductors run side-by-side and magnetically couple in a coplanar fashion. In the coplanar implementation, the single thick copper layer is used for the side-by-side placement of the coil windings, with the overlying thick aluminum and underlying thinner copper layers being used for the crossover and the cross-under connections of the interwoven windings, respectively. The magnetic coupling of coplanar coil windings is, however, inferior to that of stacked windings and, because the coplanar coupling factor (k) becomes severely degraded for higher turns ratios. Further, for coplanar arrangements, a higher turns ratio implies larger area and longer crossovers. This can degrade the loss of the balun further since the longer crossovers are implemented typically using the poorer conductivity aluminum. Because of the coplanar coupling, a 2:1 turn ratio is typically the highest that is implemented.

SUMMARY

In described examples of a magnetically coupled structure on a substrate with an integrated circuit device, the structure includes a first coil in a differential configuration, a second coil located above the first coil in a generally stacked configuration, and a center tap connection to a winding of the second coil. The first coil includes a first differential terminal, a second differential terminal, and metal windings of the first coil. The first coil's metal windings form a continuous spiral electrical path between the first and second differential terminals. The first coil's metal windings include turns and crossing connections between the turns. The turns are fabricated in an integrated circuit metal wiring level, and the crossing connections are fabricated in at least one metal level other than the metal wiring level containing the turns. The second coil is in a single-ended configuration including a single-ended input terminal, a single-ended output terminal, and metal windings of the second coil. The second coil's metal windings form a continuous spiral electrical path between the input and output terminals. The second coil's metal windings include turns fabricated in an integrated circuit device metal bonding layer. The center tap is positioned to create a balanced structure.

BRIEF DESCRIPTION OF THE DRAWINGS

FIGS. 6A-6C are top and schematic layer views of a balun implemented in a stacked single-ended on differential inductor configuration.

DETAILED DESCRIPTION OF EXAMPLE EMBODIMENTS

Figure 1:
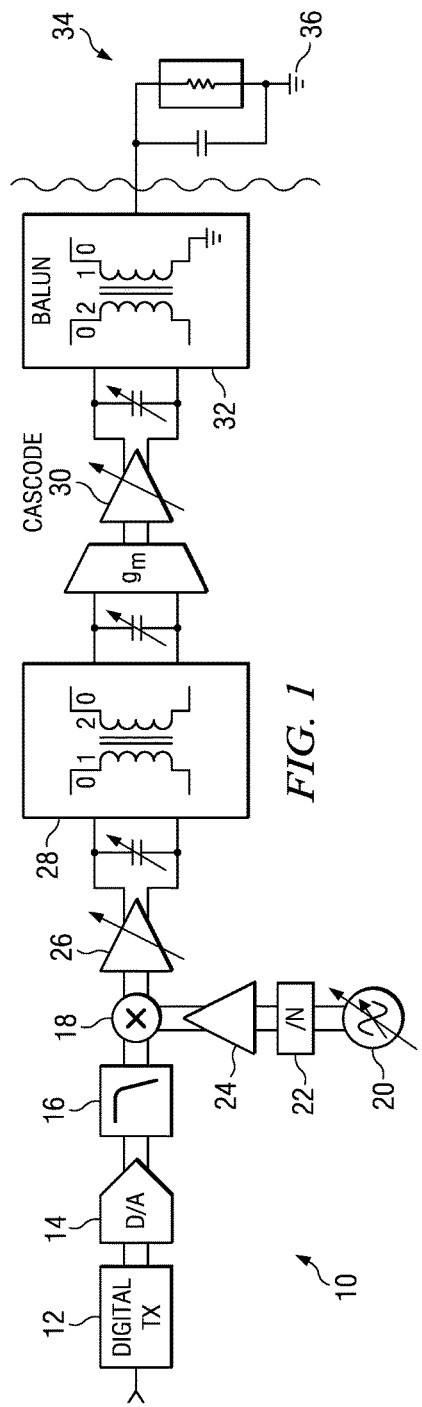
FIG. 1 is a block diagram of a radio frequency (RF) transmitter circuit of a type to which example embodiments are applicable.

FIG. 1 is a block diagram of a typical wireless communication transmitter (TX) arrangement 10 of a type to which example embodiments are applicable.

A digital input signal of voice and/or data information codified into in-phase (I) and quadrature (Q) components (viz., digital baseband signal) is received by a digital transmitter (TX) circuit block 12 (such as from the output of a digital baseband integrated circuit or DBB chip) which does filtering and other conventional digital signal processing functions. The filtered and processed digital data is then passed to a digital-to-analog (D/A) converter block 14 for conversion to an analog signal which is then filtered by a low pass filter block 16. The filtered analog data signal is then passed to a mixer 18 for modulation of a transmission frequency signal provided by a local oscillator path. In the case of a typical cellular telephone frequency band wireless transmitter (e.g., GSM Edge, Wideband CDMA, ETSI LTE, or similar), the local oscillator path may have a local oscillator 20 running at a given (e.g., 4 GHz) frequency, a/N divider 22 for dividing (e.g., by 2 or 4) to provide a divided transmission frequency (e.g., 2 or 1 GHz) at a local oscillator buffer 24 (viz., amplifier) which provides the carrier signal for modulation. Following the mixer 18, the modulated analog signal is passed to a first stage variable gain amplifier (VGA) 26 which connects to a transformer 28. The transformer 28 is used to match the impedance between two stages of amplification, the output impedance of the first stage VGA 26 (VGA Stage 1) and the input impedance of a second stage VGA (VGA Stage 2). As indicated by dual signal lines in FIG. 1, the transformer 28 receives the modulated analog signal at two inputs (generally designated as + and −) referenced to a common mode (viz., some reference voltage, e.g., ground or supply) in differential input signal form, and provides the impedance balanced modulated analog signal at two outputs (+ and −) referenced to the common mode (ground) in differential output signal form. The differential output signal is then converted by a balanced signal-to-unbalanced signal converter 32 (commonly referred to as a "balun") from its differential signal form to a single-ended output signal (viz., a single + or − output signal referenced to ground). The balun, in effect, performs a signal subtraction between its + and − inputs. The single-ended output signal is then passed to a power amplifier (PA) 34 for amplification and wireless transmission (at, e.g., 2 watts power) from an antenna 36. For the illustrated configuration, the power amplifier 34 is located off-chip (i.e., not located on the same integrated circuit chip as the other described transmitter components) and is indicated schematically as an RC load (parallel resistor and capacitor). An off-chip arrangement may, for example, be useful where the power amplifier 34 is fabricated using one semiconductor fabrication process (e.g., GaAs process) and the other components are fabricated using another fabrication process. (e.g., Si and/or SiGe CMOS, etc., process).

The location of the balun may be varied to suit individual preferences and circumstances. For the configuration illustrated in FIG. 1, the balun is located after the power amplifier driver (PA Driver) circuitry at the output of the VGA Stage 2. The balun may also be located elsewhere in the transmitter chain, such as before the VGA Stage 2. Also, although shown incorporated into a same chip with other transmitter components formed, e.g., in a digital CMOS fabrication process, baluns according to principles of example embodiments are also candidates for formation off-chip together with the power amplifier itself, e.g., in a GaAs fabrication process.

Baluns have been integrated with other components on the same die using stacked arrangements of primary and secondary coils formed in superposed relationships in different thick copper (Cu) layers, with readily usable other metal layers available for crossovers and cross-unders. The integration of baluns with other components on the same chip in many modern device fabrication processes is, however, hampered by restrictions in the number and thicknesses of available metal layers. For example, a typical modern digital CMOS process flow used for fabricating wireless communication transmission/receiver channel components may have only two thick metal layers (viz., thicknesses greater than or equal to 1 µm) available: a single thick interconnect layer in copper and a top metal layer of typically aluminum used for bonding. All other metal layers are thin lower layers (viz., thicknesses less than 1 µm) used for digital routing and having typical thicknesses being in a range of about 0.1 to 0.3 or less. Examples of available metal layers/thicknesses are given in Table 1, below, with optional levels/thicknesses shown in parentheses. The layers of a digital CMOS C014 (DRPu) process are shown schematically in FIG. 2. This process flow, for example, has available a single copper (Cu) metal layer (M7) of about 2.4 µm thickness, a top metal aluminum (Al) bonding layer (MET- TOP or ALCAP) of about 1.26 μm thickness, and six thin metal layers (M1-M6) of about 0.15 μm thickness or less, separated by interlevel dielectric layers of typically about 0.11 μm thickness.

|  | C027 (DRP2) (90 nm) | C021 (DRPe) (65 nm) | C014 (DRPu) (45 nm) | C28 (28 nm) | Comp. (130 n) |
|---|---|---|---|---|---|
| M1 | 0.25 μm | 0.14 μm | 0.095 μm | 0.1 μm | 0.32 μm |
| M2 | 0.25 | 0.16 | 0.15 | 0.1 | 0.32 |
| M3 | 0.25 | 0.16 | 0.15 | 0.1 | 0.32 |
| M4 | 0.25 | 0.16 | 0.15 | 0.1 | 0.32 |
| M5 | 0.25 | 0.16 | 0.15 | 0.1 | 0.8 |
| M6 | 1 | 1.6 | 0.15 | 0.1 | 3 |
| M7 |  |  | 2.4 | 1.6 (2.4) |  |
| (M8) |  |  | (2.4) | (2.4) |  |
| ALCAP/METTOP | 1 | 1 | 1.26 | 1.26 | 1.2 |

Figure 12:
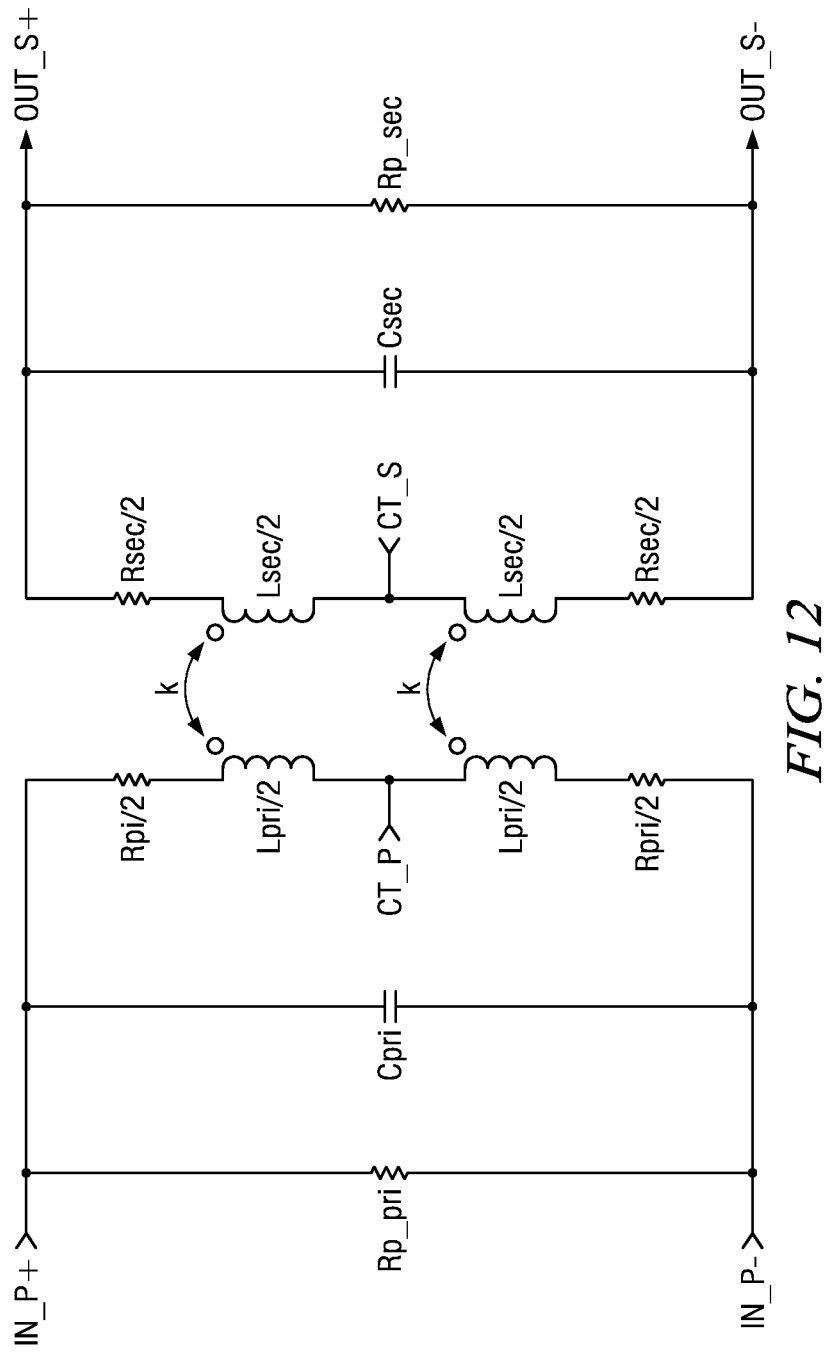
FIG. 12 is a schematic diagram of showing two coupled differential inductors.

FIG. 12 is a schematic diagram showing two coupled differential inductors which are magnetically coupled and usable for differential-to-single-ended conversion and impedance matching. Each of the primary and secondary coil windings have positive and negative input/output terminals (IN_P+, IN_P− for the primary coil and OUT_S+, OUT_S− for the secondary coil), and each has a center tap (CT_P for the primary, and CT_S for the secondary) which, for differential signals, is connected to the common mode voltage (typically ground or supply). For balun operation, the single-ended side is connected with the center tap left open and one of the input/output terminals (typically the negative terminal) grounded. Thus, with the primary connected to receive the differential input signal and the secondary connected to deliver the single-ended output signal (no DC current), the secondary center tap CT_S is left open and the secondary negative output terminal OUT_S− is connected to ground. In example implementations, self-resonance=>capacitance=>tuning range, frequency coverage; and DC resistance impacts Pout and ACLR (voltage headroom) 50 mA on 2 ohms=>1.445V/1.55V=>0.3 dB Pout hit, 0.6 dB ACLR hit.

Figure 3A:
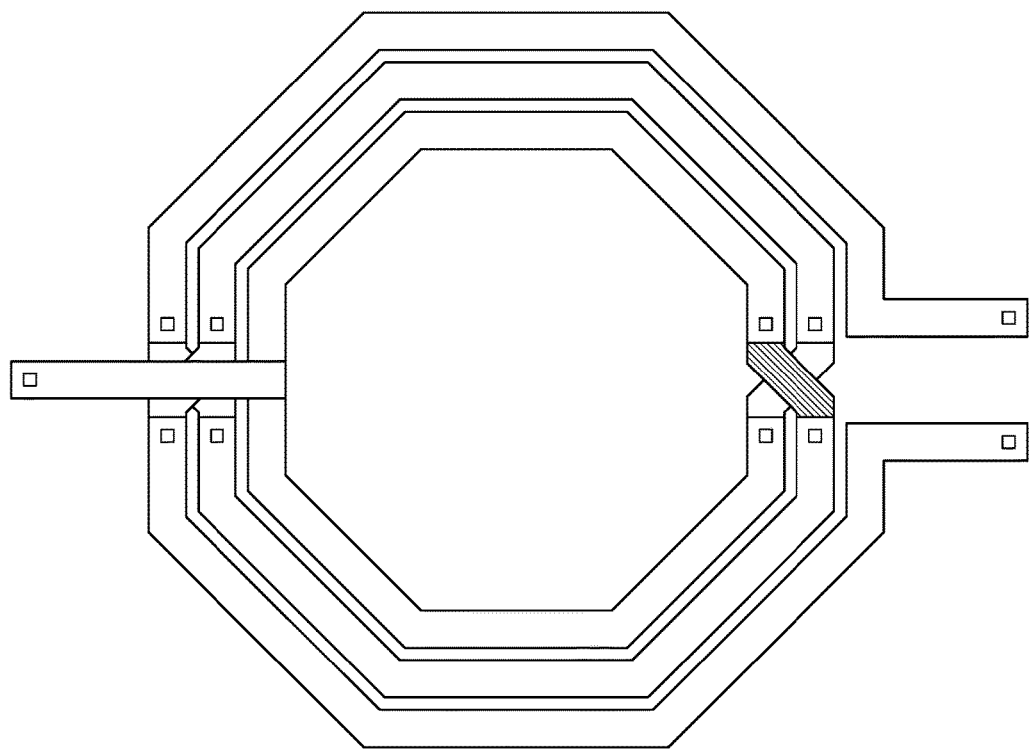
FIGS. 3A and 3B are a top view and an enlarged partial view of a differential inductor implemented in a integrated circuit fabrication flow process.
Figure 3B:
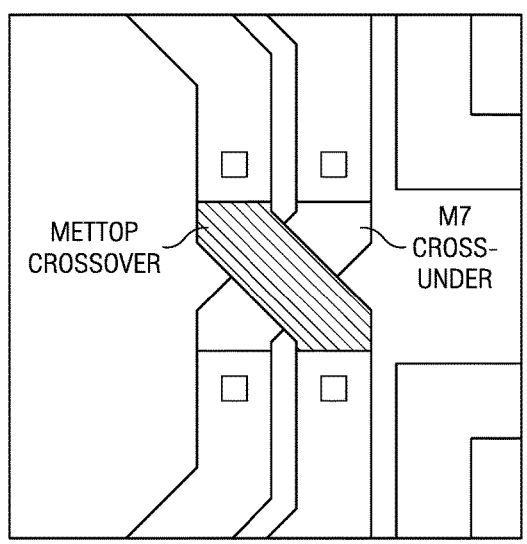

FIGS. 3A and 3B illustrate a differential inductor implementation for a single primary or secondary coil integrated within the flow of an integrated circuit fabrication process. The illustrated configuration shows a coil winding having three turns. At least two metal layers are used to implement the windings. One metal layer (viz., thick copper layer M7) is used for implementation of the three turns. The turns are coplanar and concentric, evenly-spaced with uniform widths, with each successive turn having a greater radius and being spaced by a same interval spacing from the next adjacent turn. As shown, the turns are implemented in octagonal form with increasing lengths of sides of the octagons. Other polygon or curved configurations or uneven spacings and widths are possible. Another metal layer (viz., one of the overlying thick aluminum bonding layer ALCAP or underlying one or more thin copper or other metal layers M1-M6) are used to make crossover or cross-under connections between the turns. The example differential inductor has an odd number (three) of main turns (windings) formed using an M7 copper layer of 2.4 μm thickness, identical 6 μm widths and 2 μm spacings, with crossovers between the main turns provided by a METTOP aluminum layer of 1.2 μm thickness. Crossover areas of non-copper material are preferably minimized in order to minimize deleterious impact on inductor quality factor Q. A center tap lead is formed in the thin metal layers, to cross under the middle and outside turns to provide contact with the center of the inside turn (which is also the center of the three-turn coil). Contacts between the main turns and the crossovers and cross-under are established by forming via openings in the interlevel dielectric (ILD) layers that electrically separate the metal layers, and filling the via openings with conductive material (e.g., copper or tungsten). The use of an odd number of turns provides a symmetrical device. For an odd number of turns, the total numbers of crossovers and cross-unders are identical.

The illustrated configuration has two differential input/output terminals (IN_P+ and IN_P− terminals in FIG. 12) made at the ends of the outer turn, and a common mode terminal (center tap) made by a crossover or cross-under connection to the center of the inner turn. The shown configuration also has crossover or cross-under connections respectively joining inner and intermediate turns and intermediate and outer turns to provide a single coil (spiral-like) electrical path between the differential terminals. One of the connections between adjacent turns is made using the same (thick copper) metal layer used for the turns. The other is made using one of either an overlying (thick aluminum) metal layer (making a crossover) or an underlying (one or more of underlying thin copper layers) metal layer (making a cross-under). The common mode terminal is shown brought out from the center of the inner turn to make it accessible for connection to other circuitry on the same die. The leads to the differential input/output terminals are made using the same (thick copper) metal layer used for the turns. The lead to the center tap is made using the other of either the overlying (thick aluminum) metal layer (making a crossover) or an underlying (one or more of underlying thin copper layers) metal layer (making a cross-under). The center tap metals in this area need to use different metal layers than the inductor windings and crossings to prevent the center tap from shorting the inductor. To achieve a good balance and minimize losses, the number and areas of crossovers and cross-unders are preferably minimized, and they are preferably symmetrically placed relative to other parts of the structure. The use of an odd number of turns leads to a preferred symmetrical device.

Figure 4A:
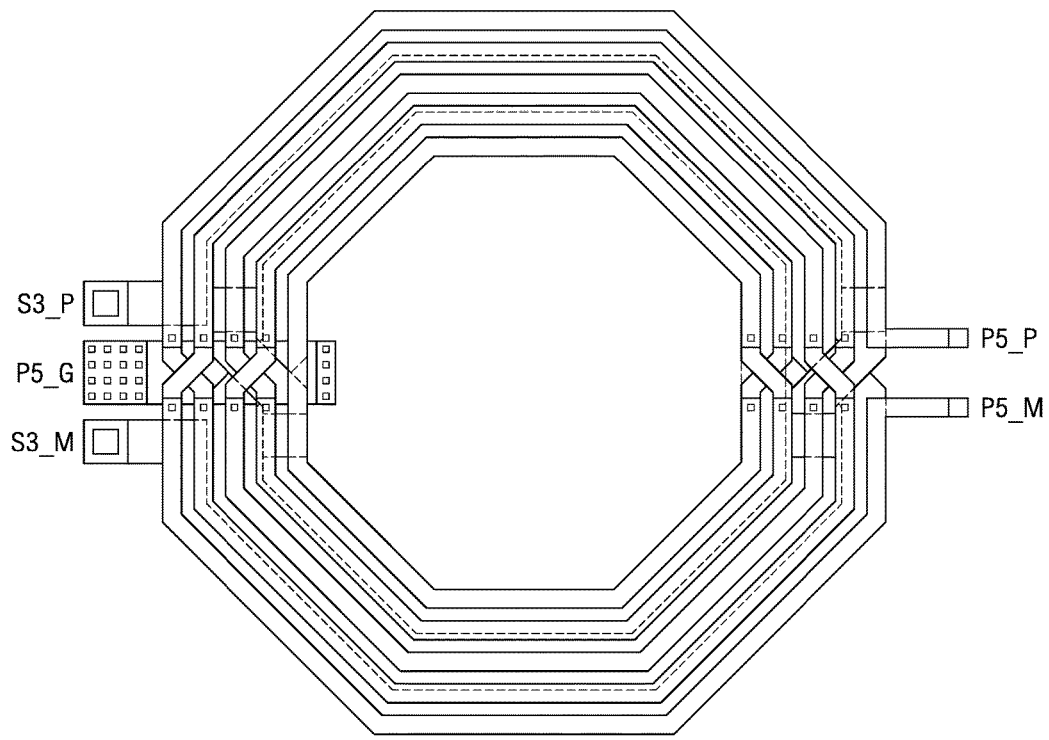
FIGS. 4A-4C are top, cross-sectional and schematic layer views of a balun implemented in a stacked differential inductor configuration.
Figure 4B:
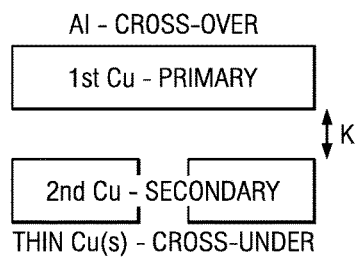
Figure 4C:
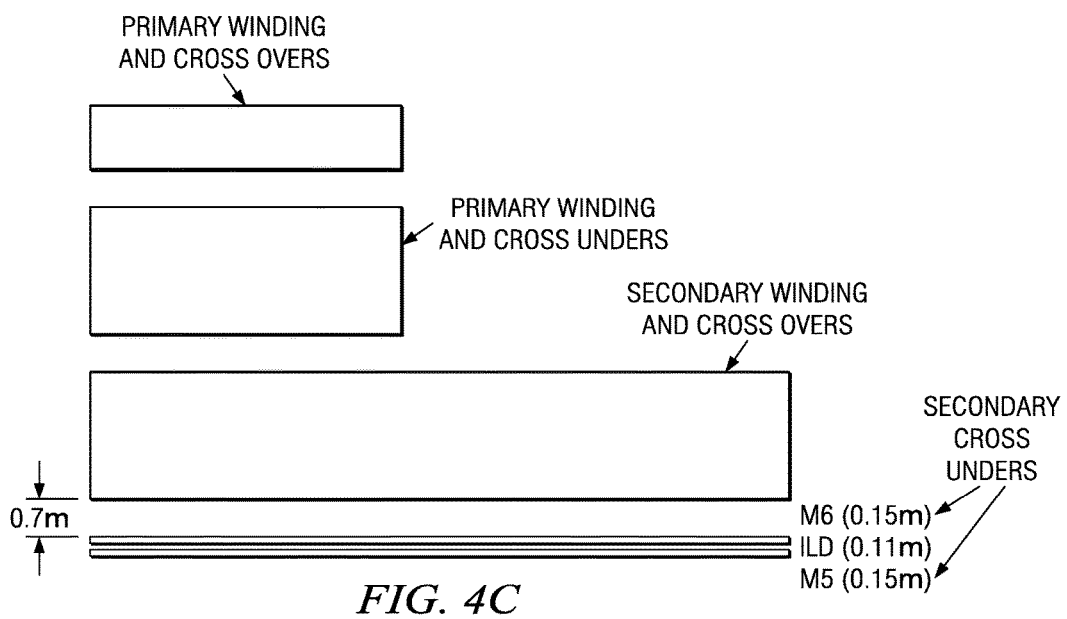

One solution to getting lower loss involves stacking two differentially wound inductors on top of each other (primary winding on top of secondary winding). Since the intermetal dielectric (IMD) layer is thinner than the minimum metal pitch, the stacked implementation has a much better coupling factor, as shown in FIGS. 4A-4C. The stacked implementation allows for H (desired) and E (undesired) field confinement; so, higher turn ratios may be easily implemented without negatively impacting k, or the area, or the loss due to longer crossovers. Because the stacked implementation involves two differential windings, both windings need cross-unders (additional metal for crossings) as shown in FIG. 4C. This means that additional metal layers are needed to implement this structure. This solution then needs at least two thick metal layers in addition to the thick aluminum layer already present.

A stacked approach to balun (and transformer) implementation using two superposed coils is illustrated schematically in FIGS. 4A-4C. This approach uses two differential coils, each having a form similar to that shown in FIG. 3. The primary and secondary (which could alternatively be reassigned as the secondary and primary) windings are each formed using a thick copper metal layer. The turns of the secondary coil are formed in the M7 thick copper metal layer, for example, and the turns of the primary coil are formed in another M8 thick copper metal layer which, for processes having only one thick copper layer (viz., M7), is added to the normal flow of the integrated circuit fabrication process (together with a corresponding additional masking step). Cross-connections between turns and for leads to the coil terminals are provided by the overlying aluminum bonding layer (ALCAP) and the underlying thin metal layers (M1-M6) (or, for locations where no conflict is present, by the other of the two thick copper layers M7 or M8). As illustrated in FIG. 4B, the magnetic coupling (k) for the superposed coils is good for different turns ratios, for preferred configurations which minimize the numbers and areas of crossings and which maintain a relationship whereby the lateral area occupied by the turns and spacings of the primary coil matches the area occupied by the turns and spacings of the second coil, i.e.:

$$N1 \times W1 + (N1-1) \times S1 = N2 \times W2 + (N2-1) \times S2; \quad (1)$$

where N1, N2=number of turns, W1, W2=width of the turns, and S1, S2=spacing between turns. A main disadvantage of this approach, therefore, is the time and expense needed to add process steps (i.e., additional thick copper metal layer and masking steps) to a flow which would otherwise only utilize a single thick copper metal.

Figure 5A:
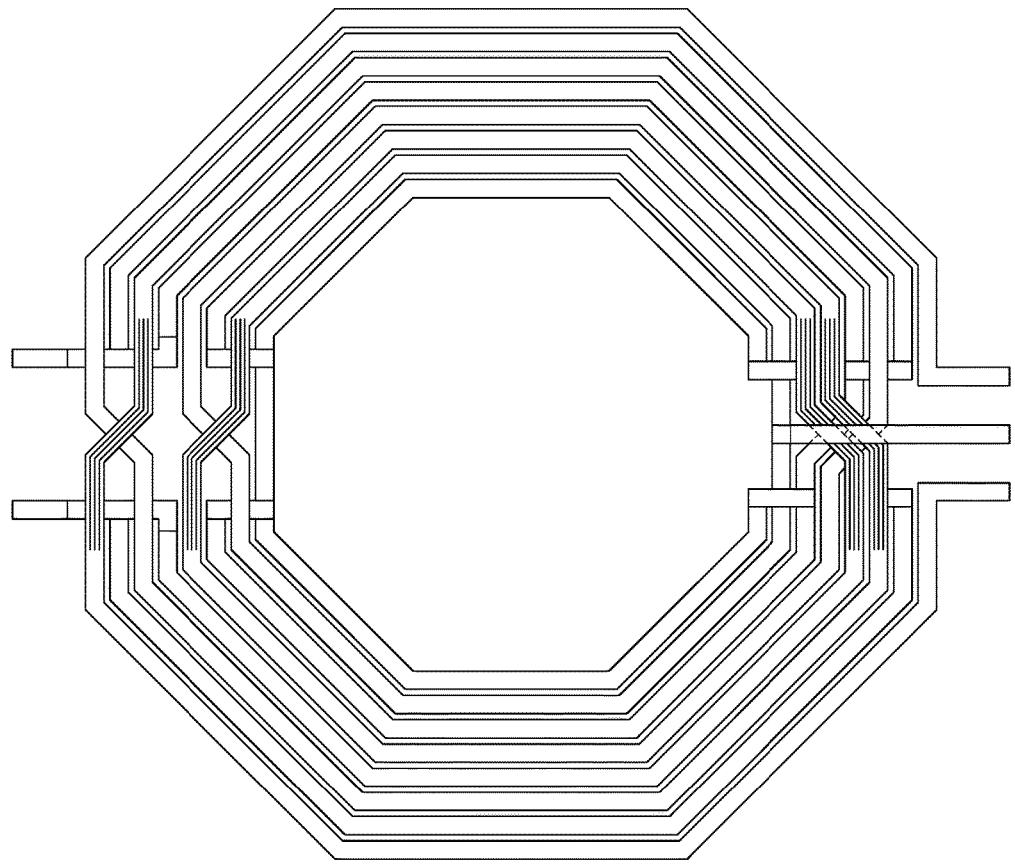
FIGS. 5A and 5B are top and schematic layer views of a balun implemented in a coplanar differential inductor configuration.
Figure 5B:
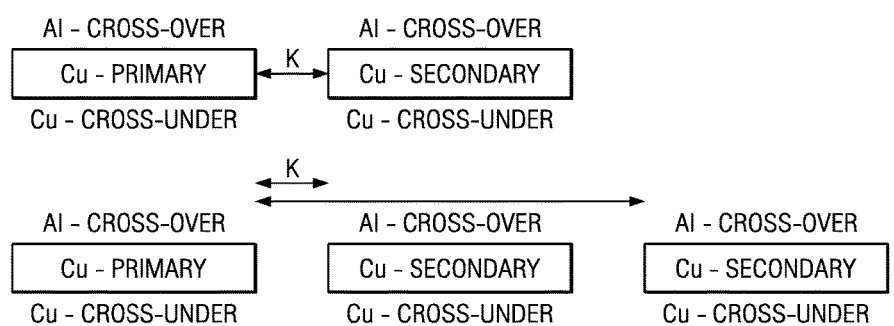

Another approach to balun (and transformer) implementation is illustrated in FIGS. 5A and 5B. Here, primary (or secondary) and secondary (or primary) differential coil windings are formed in a coplanar arrangement using a single thick copper metal (viz., M7) layer, wherein turns of one coil winding are alternated with adjacent turns of the other coil winding. Crossings for connecting adjacent turns of each same coil winding and crossings for leads to/from internal terminals of the coil windings are made using the overlying thick aluminum top layer (crossovers in ALCAP layer) and in one or more of the underlying thin metal layers (cross-unders in M1-M6 layers). Because of their side-by-side relationships, the 1:1 (upper) and 1:2 (lower) turns ratio coplanar arrangements depicted schematically in FIG. 5B will have poorer magnetic coupling (k) (1:2 even poorer than 1:1) than similar turns ratio structures implemented using the previously discussed stacked arrangements of FIGS. 4A-4C. Moreover, the side-by-side coil windings of coplanar implementations will require greater area (at least twice the die surface area) than coil windings of corresponding stacked implementations. Large pitch (i.e., spacing) between turns provides better process control, but leads to smaller k.

Figure 6B:
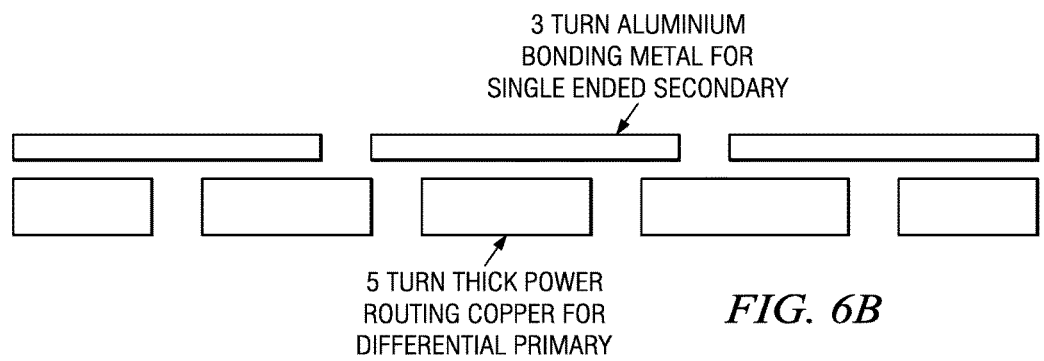
Figure 6C:
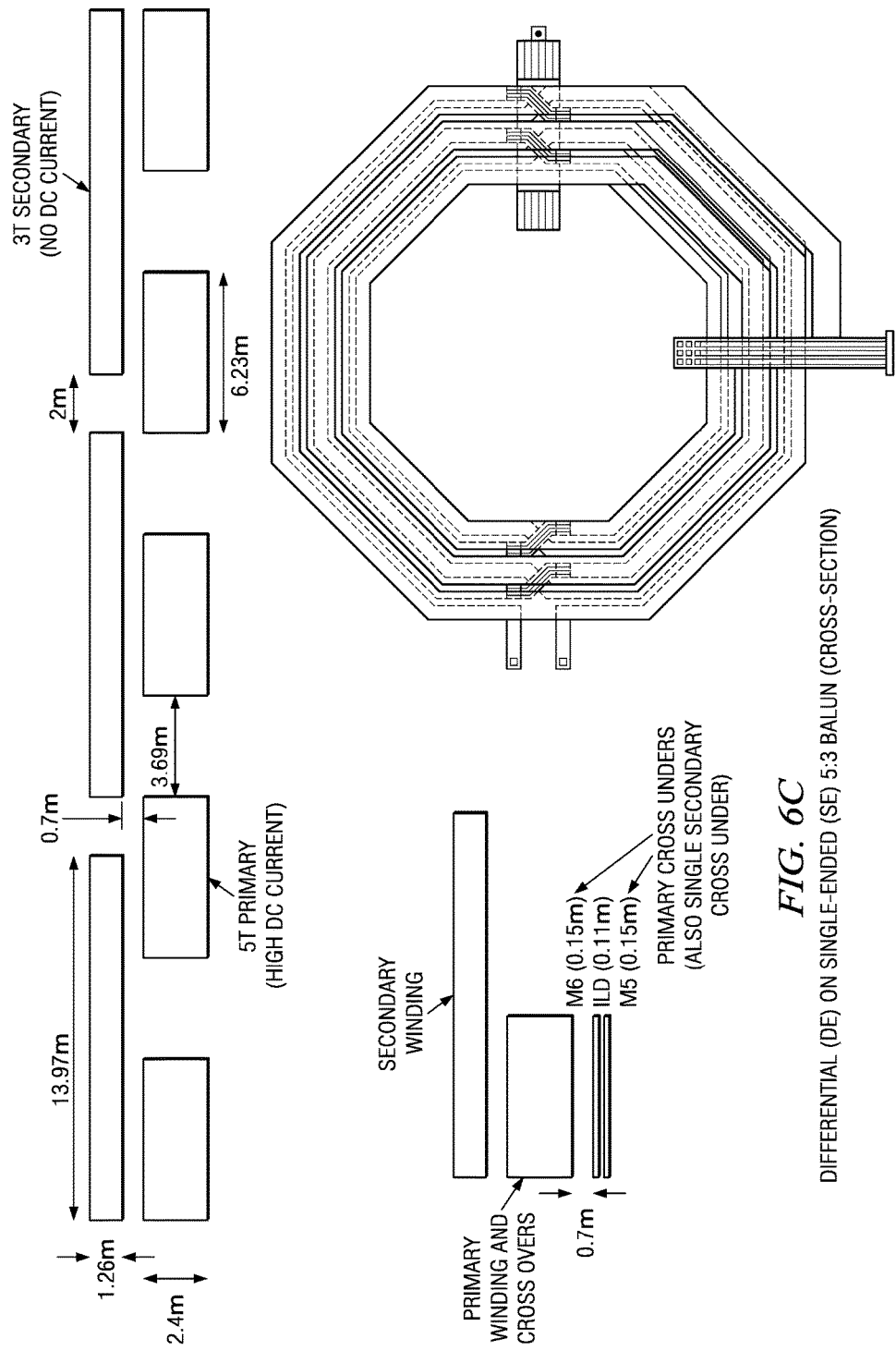

In the absence of a second thick copper layer, a stacked balun can be realized by placing a single-ended winding (secondary) on top of the differential primary winding. The single-ended inductor may be built with the thick aluminum and only a single cross-under. The single-ended winding is rotated by 90 degrees, thereby allowing the cross-under for the single-ended winding to be implemented using the same metals as the cross-unders used for the differential winding. This is illustrated in FIGS. 6A-6C. In order to implement this, the innermost single-ended winding is first slightly jutted inwards and then routed down through a via to the cross-unders, which are then routed to the outside. This point of the secondary winding of the balun is typically the ground connection and can potentially be directly connected to a ground core pad (in the case of a flip-chip assembly) in the center of the balun. In this configuration, there is no need for any cross-unders. Because of the small size for internal core pads versus the inner diameter, this option has minimal impact on the balun loss.

The primary differential winding is implemented using the single thick copper layer with two thin lower metal layers being used as cross-unders, as is typically done for a differential inductor. The lower metals are 10 times thinner than the copper of the main winding and can be a substantial Q bottleneck. The inner radius, width and spacing of the two windings are optimized to provide lowest loss. The total dimension of the five primary winding widths plus spacings is kept equal to the three secondary winding widths plus spacings in order to maximize k (see FIG. 6 and Equation (1)). An odd number of turns on the differential winding provides a fully symmetric structure since the numbers of crossovers and cross-unders are equal around both sides of the center tap. The primary winding is implemented using the single thick copper layer with the thin lower metal layers being used as cross-unders as is typically done for a differential inductor. The single-ended secondary winding is implemented using the Al RDL (ALCAP or METTOP).

For the balun at the transmitter (TX) output, the primary winding typically carries heavy DC current and should thus preferably be wound using copper in order to mitigate electromigration. Further, a wide center tap is preferably used to handle the current. Simulations can be performed to ensure that electromigration will not be an issue, particularly in the hot temperature and max R (thinnest metals) cases. For copper, a general rule of 10 mA/um$^2$ of cross-sectional area can be used as a first order approximation. The secondary winding does not carry DC current and so can be implemented using aluminum. If the balun is placed before the final preamplifier (PA) driver, the same considerations apply, because the gate of the preamplifier driver does not need any DC bias current. The same applies for a balun located at the input of the low noise amplifier (LNA), since the LNA gate does not draw any DC current. As a first order approximation, aluminum has less than 40% of the current carrying capacity of copper.

The described embodiment uses only a single thick metal layer. The stacked metal maximizes the high coupling factor because of the confinement of both the H and E fields. The described stacked implementation is area efficient—utilizing approximately the same amount of area as a single inductor. It enables use of the shortest crossovers, thereby providing the lowest loss. Because the secondary inductor is wound in a single-ended configuration, it can be implemented using a single thick Cu metal. Since the secondary inductor does not carry DC current in both the case of a balun on the preamplifier (PA) stage driver output and the case of a balun on the preamplifier (PA) stage driver input, the single-ended secondary inductor is implemented using aluminum with minimal electromigration impact. The single-ended winding for the secondary allows for half or quarter (or even ⅛th) turns to be implemented. Accordingly, a 5:2.5 turn balun can be readily implemented. This allows for great flexibility in impedance matching.

A four port network analyzer is used to measure the balun with the center tap of the primary AC grounded. An open and short deembedding process is used to calibrate out the balun feeds and obtain 4 port Z-parameters. Ports 1 and 2 are the plus and minus of the primary and ports 3 and 4 are the plus and minus of the secondary. Port 3 is ground connected as is the case in the actual balun. The following key balun parameters are extracted:

$$Ld_p = \frac{1}{2\pi f} \operatorname{Im}[z(1,1) - z(1,2) - z(2,1) + z(2,2)] \quad (2)$$

$$Qd_p = \frac{\operatorname{Im}[z(1,1) - z(1,2) - z(2,1) + z(2,2)]}{\operatorname{Re}[z(1,1) - z(1,2) - z(2,1) + z(2,2)]} \quad (3)$$

$$Ls_s = \frac{1}{2\pi f} \text{Im}[z(4, 4)] \quad (4)$$

$$Qs_s = \frac{\text{Im}[z(4, 4)]}{\text{Re}[z(4, 4)]} \quad (5)$$

$$Md = \frac{1}{2\pi f} \text{Im}[z(4, 1) - z(4, 2)] \quad (6)$$

$$kd = \frac{M_d}{\sqrt{Ld_p \times Ls_s}} \quad (7)$$

Figure 7:
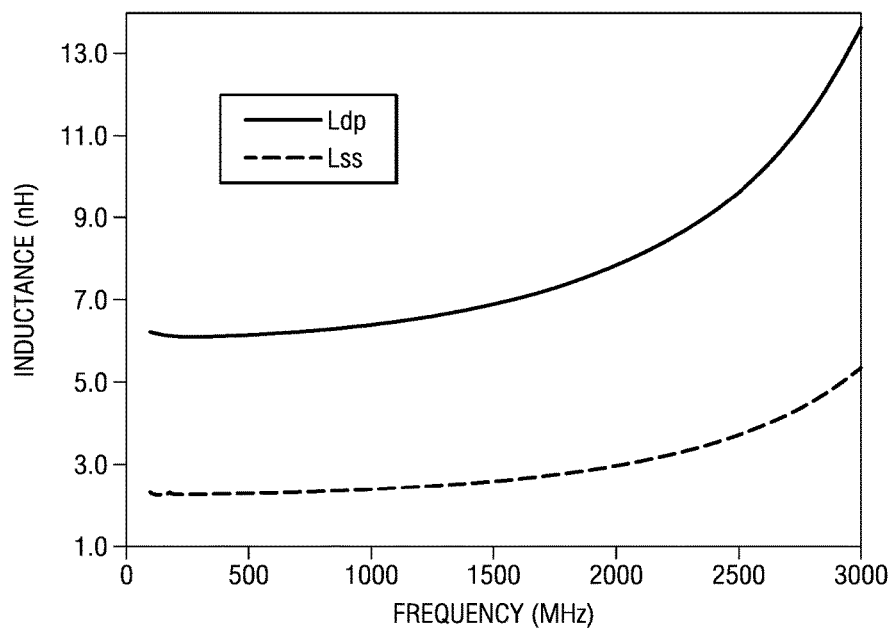
FIGS. 7-9 are graphs helpful in understanding parameters of the implementation of FIGS. 6A-6C.
Figure 8:
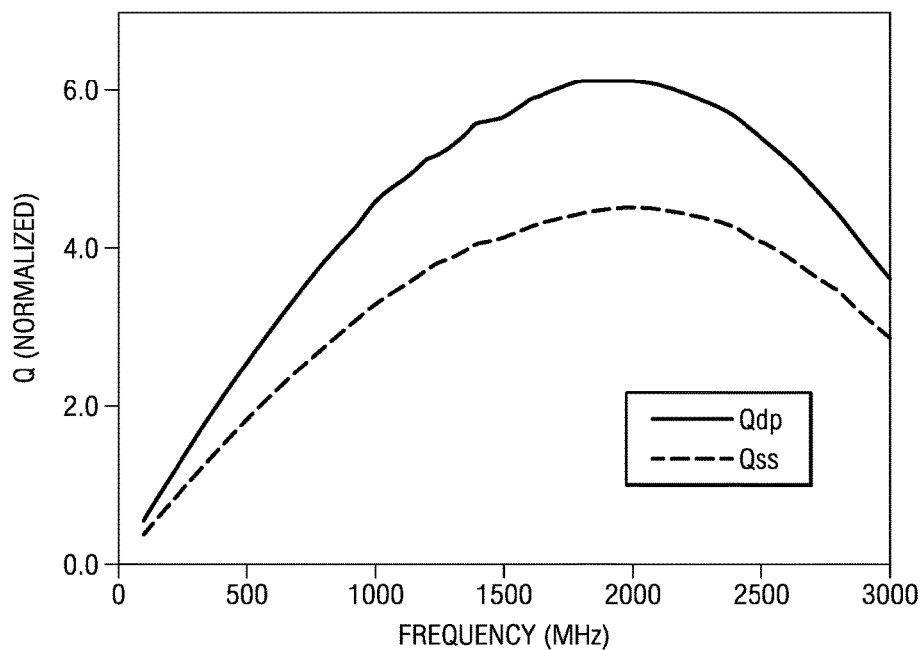
Figure 9:
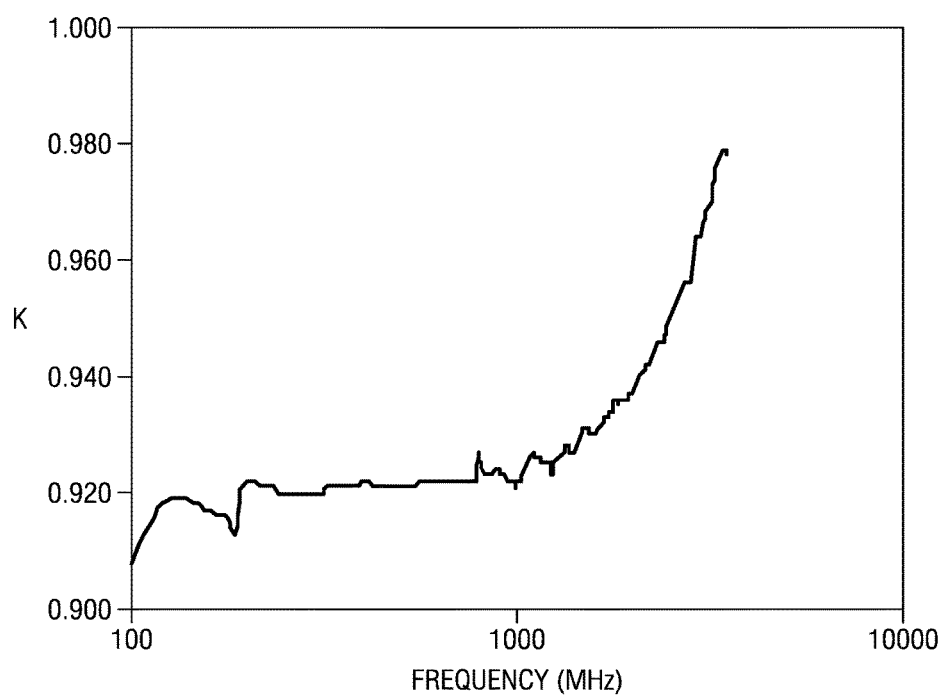

FIG. 7 shows the extracted Ldp (differential inductance on primary) and Lss (single-ended inductance on secondary) for the high band balun. FIG. 8 shows the normalized extracted Qdp (differential Q on secondary) and Qss (single-ended Q on primary). FIG. 9 shows kd, the coupling factor between the primary and secondary inductors. The flatness of the k curve shows that up to 1 GHz, the balun coupling is entirely magnetic. At higher frequencies, undesirable capacitive coupling kicks in increasing k. Having a single-ended winding over a differential structure can impact the amplitude and phase imbalance of the differential portion. This will impact the balun loss and dynamic range of the amplifier. The loss of the balun is obtained with an ideal balun at the input and a matched input and matched output. The loss is composed of losses due to metal Q, coupling, and phase and amplitude imbalance.

Table I gives measured performance for the low band balun at 870 MHz and the high band balun at 1845 MHz.

TABLE I

Measured Balun Performance

| | Band | |
|---|---|---|
| | Low Band | High Band |
| | Frequency | |
| | 870 MHz | 1845 MHz |
| | Area (mm2) | |
| | 0.096 | 0.078 |
| Ldp (nH) | 8.58 | 7.46 |
| Lss (nH) | 3.16 | 2.82 |
| Qdp | 5.1 | 6.12 |
| Qss | 3.1 | 4.84 |
| Kd | 0.94 | 0.94 |
| Loss (dB) | 2.23 | 1.55 |
| Phase imbalance | 1.5° | 1.1° |
| Amp. imbalance | 0.78 dB | 1.4 dB |

Figure 2:
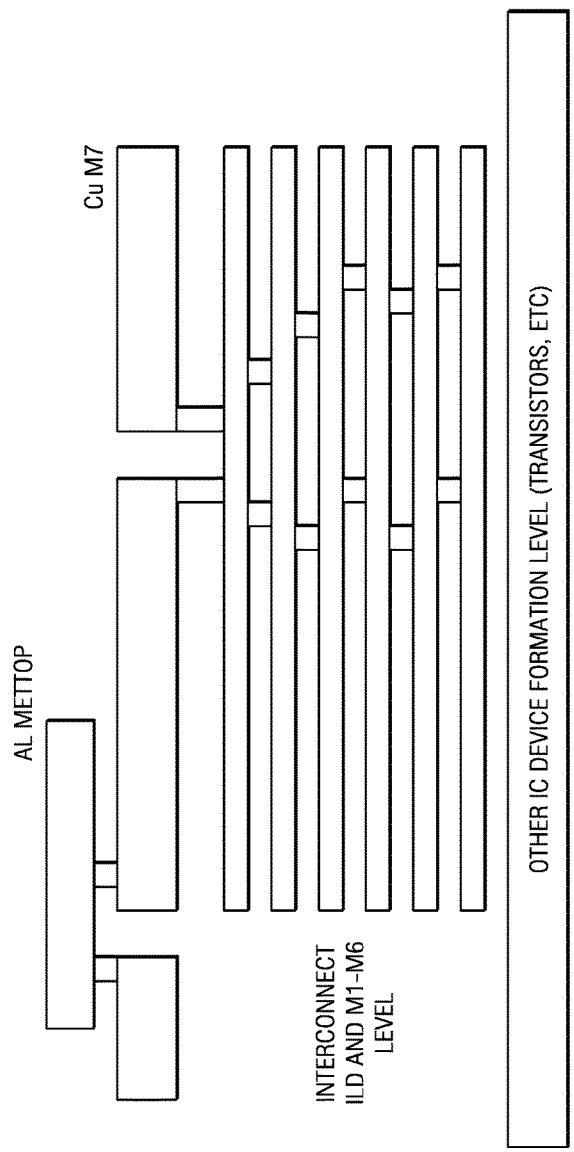
FIG. 2 is a schematic representation of layers in an example digital CMOS integrated circuit fabrication process flow.

The coupling for both baluns is very high at 0.94 compared to a measured value of 0.74 for the 2:1 balun in FIG. 2. The low band balun exhibits higher loss due to the poor Q on both the primary and secondary. This can be substantially improved by thickening both the Cu and the Al layers without impacting the coupling. The higher loss in low band is however not problematic because low band generally has higher output power (due to lower parasitics).

Figure 10:
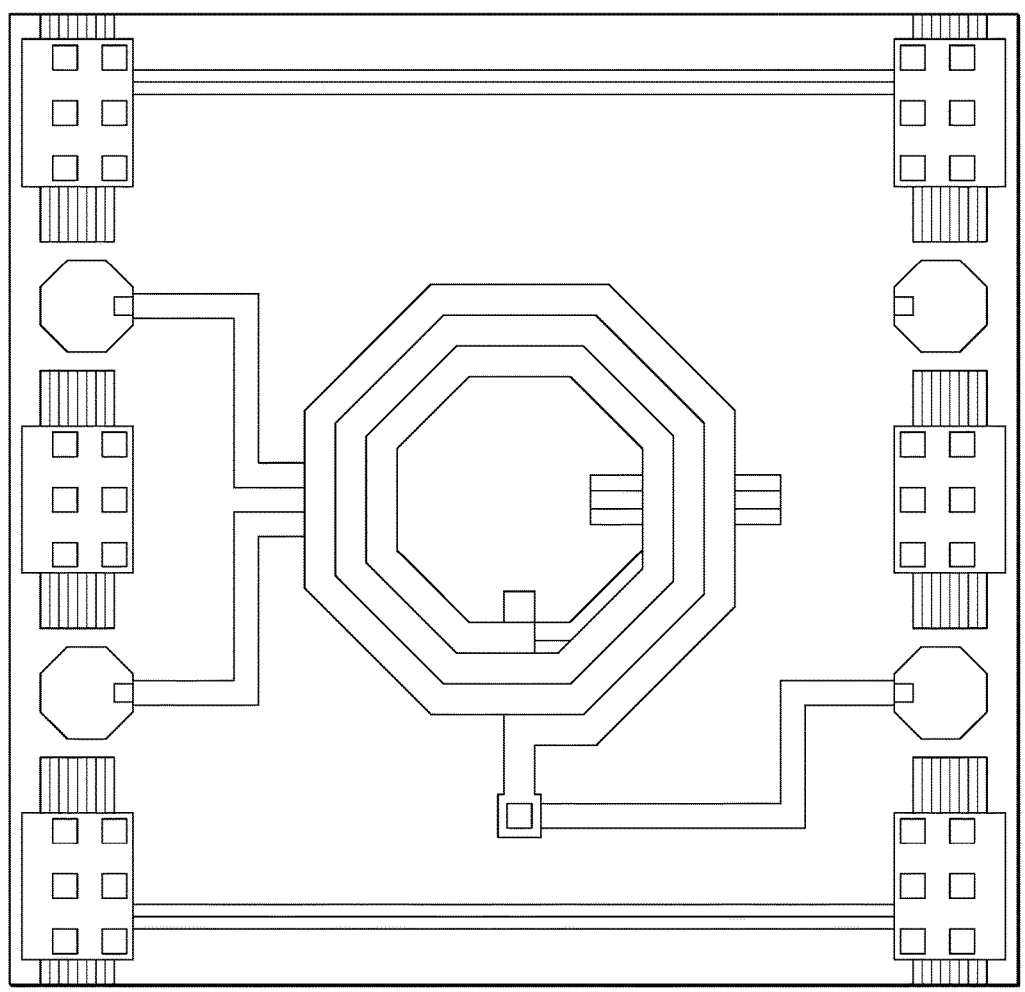
FIG. 10 is a depiction of a balun constructed as shown in FIGS. 6A-6B.

A high magnetic coupling, low loss, area efficient balun with one thick Cu primary winding and one Al secondary winding for a PA driver output has been presented. The stacked metal provides the highest coupling factor possible because of the confinement of the H field. The stacked implementation is an area efficient implementation utilizing the same area as a single inductor. It has the shortest crossovers possible, implying lowest loss. Because the secondary inductor is wound in a single-ended configuration, it can be implemented using the single thick Al layer. Since the secondary does not carry DC current in both the case of a balun on the PA driver output or PA driver input, it has minimal electromigration concerns. The single-ended winding for the secondary allows for half or quarter (or even ⅛) turns to be implemented. Hence a 5:2.5 turn balun can easily be implemented. This allows for flexibility in impedance matching. The presented balun is well-suited for integration in today's advanced nanometer digital processes. An example implementation is in the form of an integrated cellular band balun designed for a transmitter output operating from 824 MHz to 915 MHz (low band TX). With an output power of 12 dBm, a five-turn primary with a three-turn secondary (5:3) balun enables the use of a single external capacitor for impedance matching. Implemented in a standard digital 65 nm CMOS fabrication process with no additional mask requirements, the low band balun occupies an area of 0.096 mm². A second balun is designed for high band (1710 MHz to 1980 MHz) transmitter (TX) operation and occupies an area of 0.078 mm². A depiction of the low band balun is shown in FIG. 10.

Figure 11A:
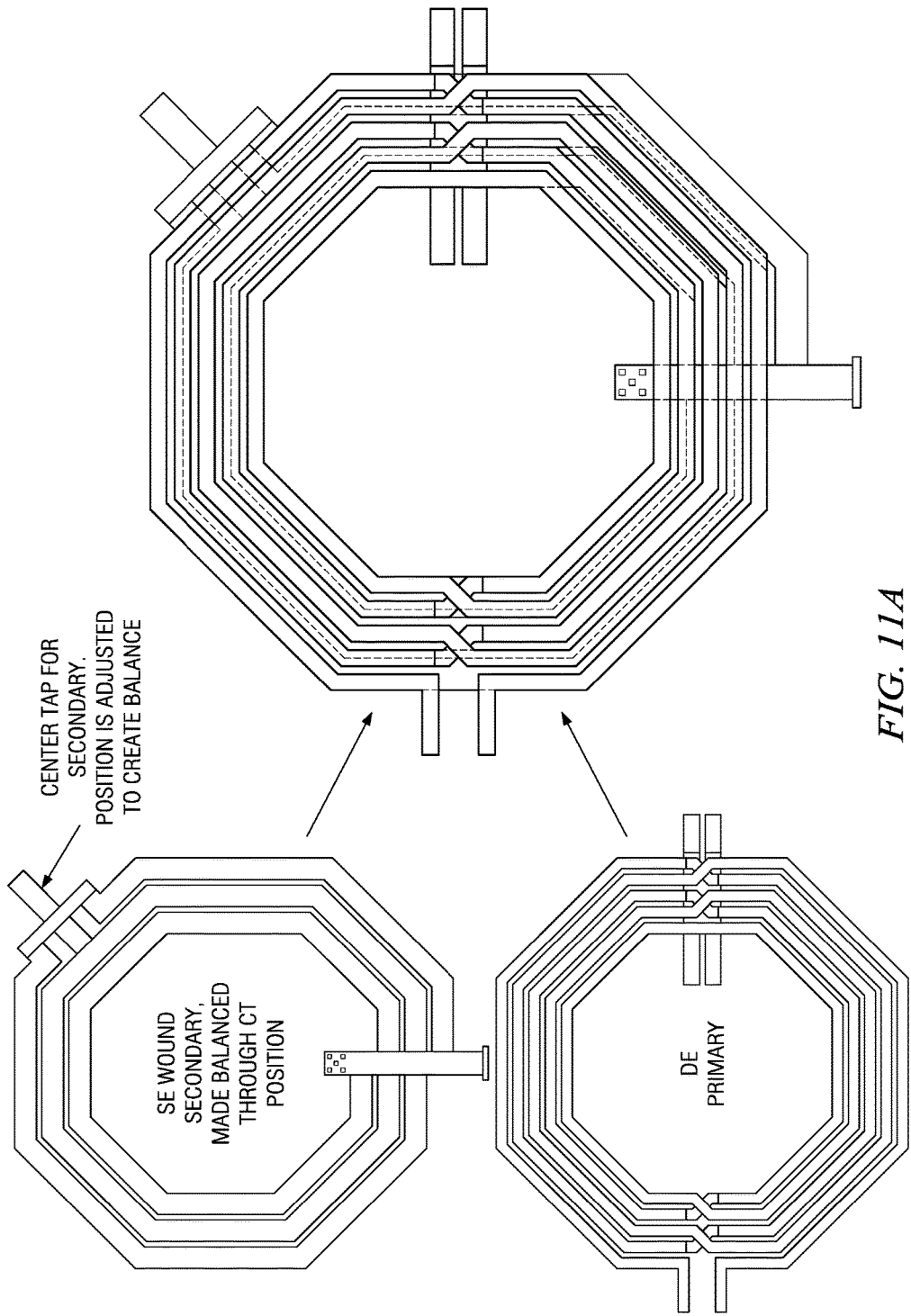
FIGS. 11A-11B are top views of a transformer implemented in accordance with the principles applied in the fabrication of the balun of FIGS. 6A-6C.
Figure 11B:
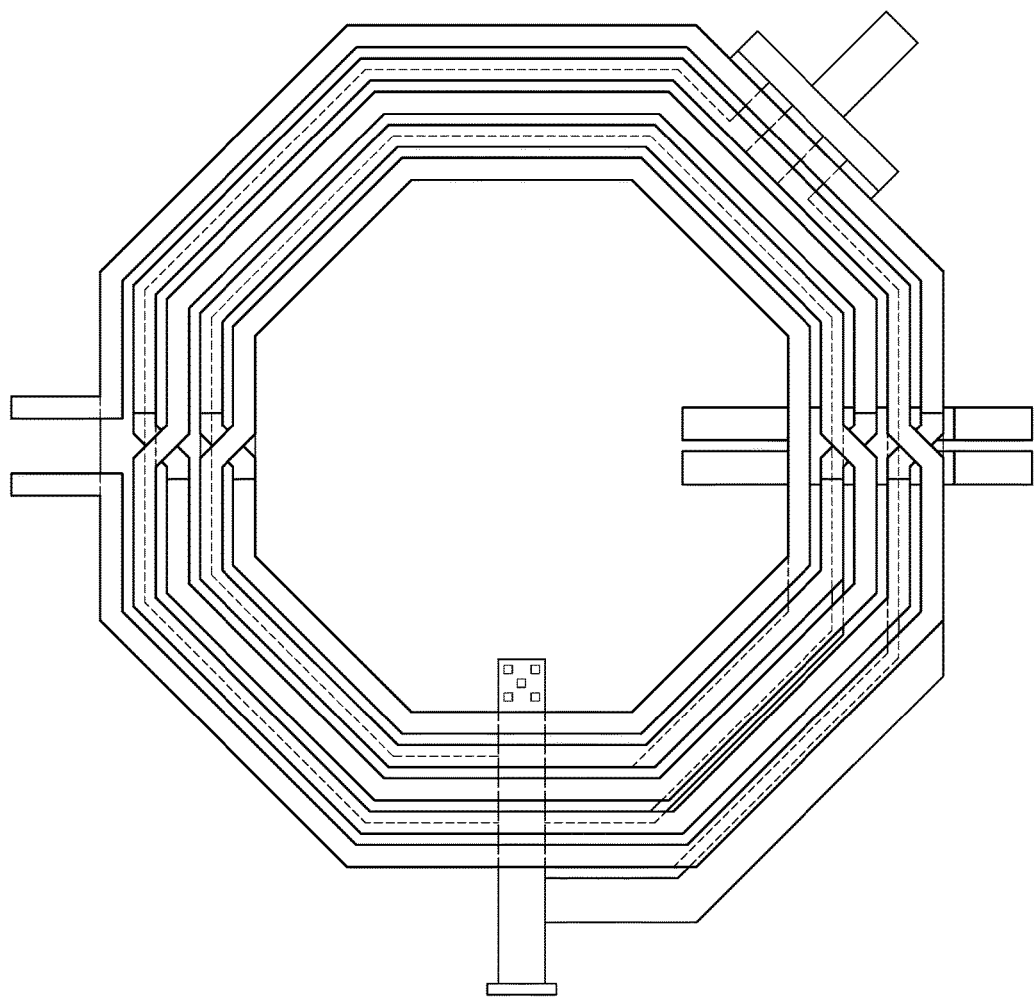

The same principles can be applied in the construction of a transformer. In contrast to a balun, a transformer is a balanced structure both on the primary and secondary, with center taps on both sides. FIGS. 11A and 11B show an approach for introducing a center tap into the single-ended wound secondary. The position of the center tap is displaced angularly until the unbalanced single-ended structure is again balanced. If the center tap on the single-ended winding (realized using the top metal layer METTOP) is to be connected to an inner turn, appropriate metal configurations are used in order to prevent conflicts (metal shorts). In the example implementation in FIG. 11 A, this is accomplished by breaking the outer turn metal at the point at which the center tap is to go into the inner turn (and connect it to the inner turn). The break of the outer turn is then shorted using the lower thick metal (M7 metal layer in this case) to realize the primary coil that is under the secondary coil (or vice versa). In order to prevent shorts with the primary (lower) coil, this connection is offset from the lower coil by routing the top metal layer METTOP first outwardly and then shorting it using the M7 metal layer. At this point, the magnetic coupling is diminished because the primary and secondary coils do not overlap, but are instead coplanar. However this occurs for only a small portion of the length of the winding. The two (primary and secondary) coils remain stacked together for the majority of the winding lengths. So the overall reduction impact on the magnetic coupling is minor.

Modifications are possible in the described embodiments, and other embodiments are possible, within the scope of the claims.

What is claimed is:

1. A magnetically coupled structure on a substrate with an integrated circuit device, the magnetically coupled structure comprising:
    a first coil in a differential configuration, the first coil including a first differential terminal, a second differential terminal, and metal windings, wherein the metal windings of the first coil form a first continuous spiral electrical path between the first and second differential terminals, wherein the metal windings of the first coil include turns and crossing connections between the turns, and wherein the turns are fabricated in a metal level of the integrated circuit device and the crossing connections are fabricated in at least one metal level of the integrated circuit device other than the metal level containing the turns;
    a second coil located above the first coil in a generally stacked configuration, the second coil being in a single-ended configuration and including a single-ended input terminal, a single-ended output terminal, and metal windings, wherein the metal windings of the second coil form a second continuous spiral electrical path between the single-ended input terminal and the single-ended output terminal, and wherein the metal windings of the second coil include turns fabricated in a metal bonding layer of the integrated circuit device; and a center tap connection to a turn of the metal windings of the second coil, wherein the center tap is positioned to create a balanced structure.

2. The magnetically coupled structure of claim 1, wherein the turn of the second coil to which the center tap connection is made is a turn other than an outermost turn of the turns of the second coil, and wherein the metal windings of the second coil further include connections routed through a metal level of the integrated circuit device other than the metal bonding layer.

3. The magnetically coupled structure of claim 1, wherein the metal bonding layer is a redistribution layer of the integrated circuit device.

4. The magnetically coupled structure of claim 3, wherein the redistribution layer comprises aluminum.

5. The magnetically coupled structure of claim 1, wherein the metal level containing the turns of the first coil comprises copper.

6. The magnetically coupled structure of claim 1, wherein the number of turns of the metal windings of the first coil is greater than the number of turns of the metal windings of the second coil.

7. The magnetically coupled structure of claim 6, wherein a ratio of the number of turns of the metal windings of the first coil to the number of turns of the metal windings of the second coil is 5:3.

8. The magnetically coupled structure of claim 6, wherein:
the metal windings of the first coil include five turns; and
the metal windings of the second coil include three turns.

9. The magnetically coupled structure of claim 1, wherein a thickness of the metal level containing the turns of the first coil is greater than a thickness of the metal bonding layer containing the turns of the second coil.

10. The magnetically coupled structure of claim 9, wherein a thickness of the metal level containing the turns of the first coil is greater than a thickness of the metal bonding layer containing the turns of the second coil by a factor of less than 2.

11. The magnetically coupled structure of claim 1, wherein:
the turns of the first coil are each evenly spaced by a first spacing; and
the turns of the second coil are each evenly spaced by a second spacing.

12. The magnetically coupled structure of claim 1, wherein:
each of the turns of the first coil has a first uniform width; and
each of the turns of the second coil has a second uniform width.

13. The magnetically coupled structure of claim 12, wherein the first uniform width is less than the second uniform width.

14. The magnetically coupled structure of claim 2, wherein the number of turns of the second coil is an odd number, and the turn to which the center tap connection is a center turn of the turns of the second coil.

15. The magnetically coupled structure of claim 2, wherein the outermost turn of the turns of the second coil includes a break at a location to which the center tap connection is made to the turn other than the outermost turn, the break being a space between a first point and a second point along the outermost turn, and wherein the first and second points are routed outwardly from the outermost turn and shorted in the metal level containing the turns of the first coil.

* * * * *